United States Patent
Matsumoto et al.

(10) Patent No.: US 7,260,768 B1
(45) Date of Patent: Aug. 21, 2007

(54) COMMUNICATION DEVICE AND COMMUNICATION METHOD

(75) Inventors: Wataru Matsumoto, Tokyo (JP); Yoshikuni Miyata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 1563 days.

(21) Appl. No.: 09/857,461

(22) PCT Filed: Oct. 20, 2000

(86) PCT No.: PCT/JP00/07312

§ 371 (c)(1),
(2), (4) Date: Jun. 5, 2001

(87) PCT Pub. No.: WO01/33719

PCT Pub. Date: May 10, 2001

(30) Foreign Application Priority Data

Oct. 29, 1999 (JP) ........................................... 11-308750

(51) Int. Cl.
*H03M 13/03* (2006.01)

(52) U.S. Cl. ........................ 714/786; 714/784; 714/788; 714/794; 714/795; 375/262; 375/295; 375/341

(58) Field of Classification Search ................. 714/784, 714/786–796; 375/262, 341, 295
See application file for complete search history.

(56) References Cited

U.S. PATENT DOCUMENTS

| | | | |
|---|---|---|---|
| 5,233,629 A | | 8/1993 | Paik et al. |
| 5,446,747 A | * | 8/1995 | Berrou ........................ 714/788 |
| 6,507,621 B2 | * | 1/2003 | Matsumoto et al. ........ 714/784 |
| 2002/0067779 A1 | * | 6/2002 | Jaffe et al. ................... 375/341 |

FOREIGN PATENT DOCUMENTS

| | | |
|---|---|---|
| EP | 0869623 | 10/1998 |
| JP | 888662 | 4/1996 |
| JP | 10136046 | 5/1998 |
| JP | 11163841 | 6/1999 |
| JP | 11215012 | 8/1999 |

OTHER PUBLICATIONS

He et al., On the aplication of turbo codes to the robust transmission of compressed images, Oct. 26–29 1997, 1997 International Conference on Image Prcesing, pp. 559–562.*
M.C. Valenti, Inserting turbo code technology into the DVB satellite broadcasting system, Oct. 10 2000, 21st Century Military Communications Conference Proceedings, pp. 650–654 vol. 2.*
Lee et al., TCM, TTCM, BICM and iterative BICM asisted OFDM–based digital video broadcasting to mobile receivers, Jun. 6 2001, IEEE VTS 53rd Vehicular Technology Conference 2001, pp. 732–736 vol. 1.*
"Turbo–Codes and High Spectral Efficiency Modulation" by Stephane Le Goff, Alain Glavieux and Claude Berrou, p. 645, IEEE Journal, Mar. 1, 1994 Telecom Bretagne, France Telecom University.

* cited by examiner

*Primary Examiner*—Guy J. Lamarre
(74) *Attorney, Agent, or Firm*—Birch, Stewart, Kolasch & Birch, LLP

(57) ABSTRACT

A communication device is provided with a turbo encoder (1) which carries out a turbo encoding process on the lower two bits of transmission data so as to output information bits of two bits and redundant bits of two bits, a conversion (2) which carries out calculations so as to uniform error-correction capabilities on respective information bits by using the output, decoders (11 to 18) which carries out a soft-judgment on the lower two bits of the received signal that are susceptible to degradation in the characteristics so as to estimate the original transmission data, and a second judging device (19) which carries out a hard-judgment on the other bits in the received signal so as to estimate the original transmission data.

15 Claims, 9 Drawing Sheets

FIG.4
(a)
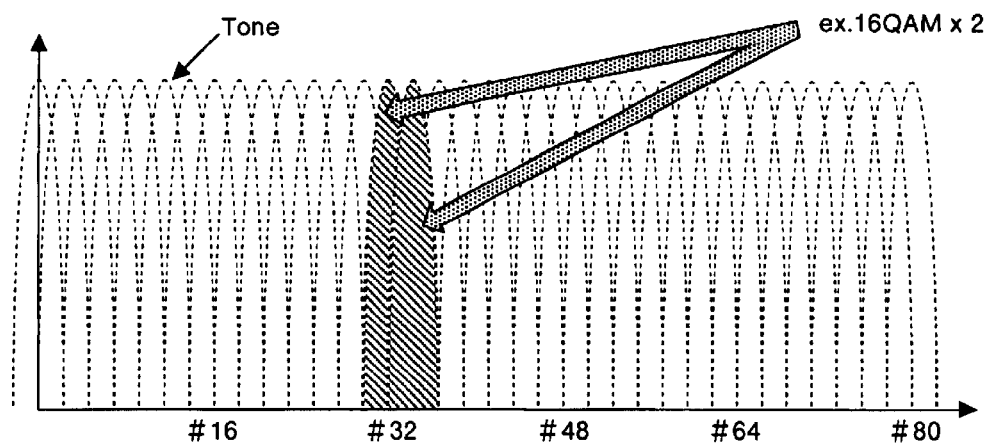
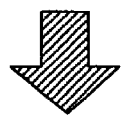
(b)
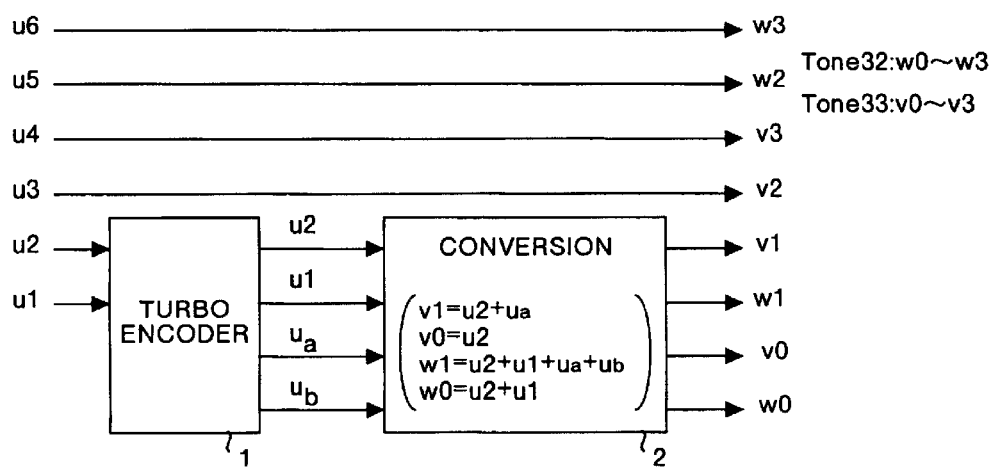

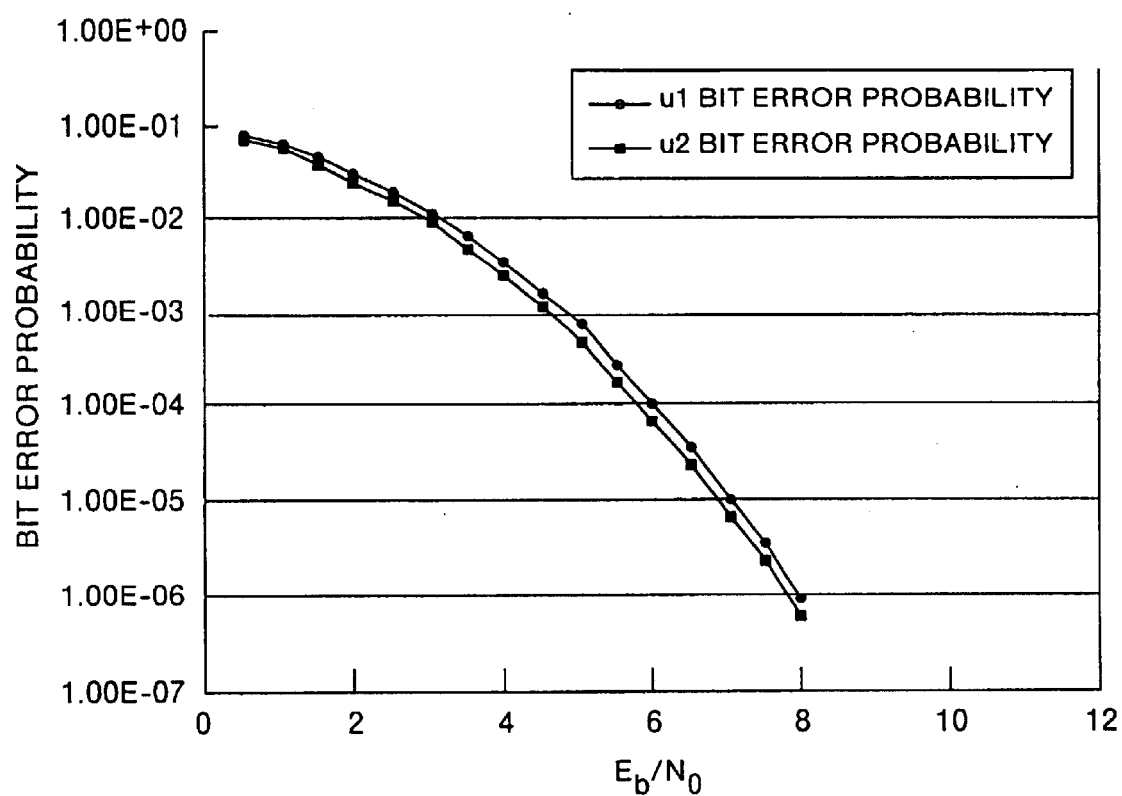

COMMUNICATION DEVICE AND COMMUNICATION METHOD

This application claims priority to Japanese Patent Application 11-308750 filed on Oct. 29, 1999.

This application is the National phase under 35 U.S.C. § 371 of PCT International Application No. PCT/JP00/07312 which has an International filing date of Oct. 20, 2000, which designated the United States of America and was not published in English.

TECHNICAL FIELD

The present invention in general relates a method of and device for communication that use a multi-carrier modem system. More particularly, this invention relates to a communication device which realizes data communication through the existing communication lines by using a method such as the DMT (Discrete Multi-Tone) modem system and the OFDM (Orthogonal Frequency Division Multiplex) modem system and a communication method capable of realizing such a communication device. However, the present invention is not intended to be limited to the communication device for carrying out data communication through the DMT modem system, and is applicable to any communication device for carrying out cable communication and radio communication through normal communication lines by using the multi-carrier modem system and a single carrier modem system.

BACKGROUND ART

The conventional communication methods will be explained below. For example, in the wide band CDMA (W-CDMA: Code Division Multiple Access) using the SS (Spread Spectrum) system, turbo codes have been proposed as error-correction codes that greatly exceed convolutional codes in their performances. In the turbo code, a list formed by interleaving an information list is encoded in parallel with a known coding list, and the turbo code is one of the error-correction codes that have attracted the greatest public attention at present, and is said to provide characteristics close to Shannon limit. In the above-mentioned W-CDMA, since the performances of the error-correction code give great effects on the transmission characteristics in the voice transmission and data transmission, the application of the turbo code makes it possible to greatly improve the transmission characteristics.

Operation of transmitting and receiving systems of the conventional communication device using the turbo code will be explained in detail below. FIG. 8 is a drawing that shows the construction of a turbo encoder used in the transmitting system. In FIG. 8(a), reference numeral 101 denotes a first recursive system convolutional encoder that subjects an information list to a convolutional encoding process to output redundant bits. Reference numeral 102 denotes an interleaver, and reference numeral 103 denotes a second recursive system convolutional encoder that subjects the information list that has been switched by the interleaver 102 to a convolutional encoding process to output redundant bits. FIG. 8(b) is a drawing that shows the inner structures of the first recursive system convolutional encoder 101 and the second recursive system convolutional encoder 103, and the two recursive system convolutional encoders are encoders that only output redundant bit respectively. Moreover, the interleaver 102, which is used in the turbo encoder, randomly switches information bit lists.

The turbo encoder, which is arranged as described above, simultaneously outputs an information bit list: $x_1$, a redundant bit list: $x_2$ obtained by encoding the information bit list through the operation of the first recursive system convolutional encoder 101, and a redundant bit list: $x_3$ obtained by encoding the information bit list that has been interleaved through the operation of the second recursive system convolutional encoder 103.

FIG. 9 is a drawing that shows the construction of the turbo decoder that is used in the receiving system. Reference numeral 111 denotes a first decoder that calculates a logarithm likelihood ratio from a receiving signal: $y_1$ and a receiving signal: $y_2$. Reference numerals 112 and 116 denote adders, and reference numeral 113 and 114 denote interleavers. Reference numeral 115 denotes a second decoder that calculates a logarithm likelihood ratio from a receiving signal: $y_1$ and a receiving signal: $y_3$. Reference numeral 117 denotes a deinterleaver, and reference numeral 118 denotes a judging device for judging the output of the second decoder 115, to output an estimated value of the original information bit list. The receiving signals: $y_1$, $y_2$, $y_3$ are signals that are formed by allowing the information bit list: $x_1$ and the redundant bit lists: $x_2$, $x_3$ to include influences from noise and phasing in the transmission path.

In the turbo decoder that is arranged as described above, first, the first decoder 111 calculates the logarithm likelihood ratio: $L(U_k)$ (where k refers to the time) from a received signal: $y_{1k}$ and a received signal: $y_{2k}$. In this case, the logarithm likelihood ratio: $L(U_k)$ is represented by the following equation:

$$L(u_k) = y_{1k} + La(u_k) + Le(u_k) \qquad (1)$$
$$= \operatorname{Ln}\frac{Pr(x_{1k'} = 1|\{Y\})}{Pr(x_{1k'} = 0|\{Y\})}$$

Here, $Le(U_k)$ represents external information, $La(U_k)$ represents preliminary information that is external information preceding by one, $P_r(x_{1k'}=1|\{Y\})$ represents the probability of an estimated information bit upon receipt of the entire list $\{Y\}$ of the received signals: $x_{1k}'$ being 1 and, $P_r(x_{1k'}=0|\{Y\})$ represents the probability of an estimated information bit upon receipt of the entire list $\{Y\}$ of the received signals: $x_{1k}'$ being 0. In other words, equation (1) finds the probability of the estimated information bit: $x_{1k}'$ becoming 1 with respect to the probability of the estimated information bit: $x_{1k}'$ being 0.

Next, the adder 112 calculates external information to be given to the second decoder 115 from a logarithm likelihood ratio that is the result of the above-mentioned calculation. Based upon the above-mentioned equation (1), the external information: $Le(U_k)$ is represented by the following equation:

$$Le(U_k)=L(U_k)-y_{1k}-La(U_k) \qquad (2)$$

Since no preliminary information has been given at the time of the frist decodig process, $La(U_k)=0$, for an initial time value (k)=0.

In the interleavers 113 and 114, in order to make the received signal: y1k and the external information: $Le(U_k)$ coincident with the time of the received signal:$y_3$, the signals are re-arranged. Then, in the same manner as the first encoder 111, based upon the received signal: $y_1$ and the received signal: $y_3$ as well and the external information: $Le(U_k)$ preliminarily calculated, the second decoder 115 calculates a logarithm likelihood ratio: $L(U_k)$. Thereafter, in the same manner as the adder 112, the adder 116 calculates the external information $Le(U_k)$ by using equation (2). At this time, the external information, rearranged by the deinterleaver 117, is fed back to the first decoder 111 and the preliminary information: La(U$_k$).

Finally, in the turbo decoder, the above-mentioned processes are repeatedly executed predetermined times so that it is possible to calculate a logarithm likelihood ratio with higher precision, and the judgment device 118 makes a judgment based upon this logarithm likelihood ratio, thereby estimating the bit list of the original information. More specifically, for example, the logarithm likelihood ratio shows that "L(U$_k$)>0", the estimated information bit: x$_{1k}$' is judged as 1, while it shows that "L(U$_k$)≦0", the estimated information bit: x$_{1k}$' is judged as 0.

In this manner, in the conventional communication method, by using the turbo code as the error-correction code, even when the signal point-to-point distance becomes closer as the modulation system is multi-valued, it becomes possible to greatly improve the transmitting characteristics in the voice transmission and data transmission, and consequently to obtain characteristics superior to the known convolutional codes.

However, in the above-mentioned conventional communication method, in order to carry out an error correction with high precision, the turbo encoding process is carried out on all the information lists on the transmitting side, and on the receiving side, all the encoded signals are decoded, and a soft-judgment is then executed thereon. More specifically, for example, in the case of 16 QAM, a judgment is made with respect to all the 4-bit data (0000 to 1111: 4-bit constellation), and in the case of 256 QAM, a judgment is made with respect to all the 8-bit data. Therefore, conventionally, the application of the conventional communication method that carries out judgments on all the data as described above causes a problem of an increase in the amount of calculations in the encoder and decoder in response to the multi-valued levels.

Therefore, the object of the present invention is to provide a communication device and a communication method for such a device, which is applicable to any communication system using the multi-carrier modem system and the single-carrier modem system, and makes it possible to achieve a reduction in the amount of calculations and to provide a good transmitting characteristics in the same manner as the conventional device, even when there is an increase in the constellation due to multi-valued levels.

DISCLOSURE OF THE INVENTION

The following aspect of the communication device is disclosed with reference to FIG. 1.

The communication device according to one aspect of this invention, which uses turbo codes as error-correction codes, is provided with a turbo encoding unit (corresponding to a turbo encoder 1 in an embodiment which will be described later) which carries out a turbo encoding process on lower bits of a predetermined number in transmission data to output information bits in accordance with the predetermined number and first and second redundant bits that have been convolutionally encoded in different sequences; a computing unit (corresponding to a conversion 2) which carries out calculations for uniforming error-correction capabilities on the respective information bits by using the information bits of the predetermined number and the redundant bits to output the results of the calculations and the other bits in the transmission data as the results of the encoding process; a first decoding unit (corresponding to a first decoder 11 and an adder 12) which extracts the information bits and the first redundant bits from the lower bits of the predetermined number in the received signal, and makes a soft-judgment based upon the results of the extraction and a soft judgment output that is an output preceding by one given as preliminary information (in some cases, not given); a second decoding unit (corresponding to a second decoder 15, an interleavers 13 and 14, an adder 16 and a deinterleaver 17) which extracts the information bits and the second redundant bits, makes a soft-judgment based upon the results of the extraction and the soft-judgment output from the first decoding unit, and informs the first decoding unit of the results thereof as the soft-judgment output preceding by one; a first judging unit (corresponding to a first judging device 18) which executes the soft-judgment by the first decoding unit and the second decoding unit a predetermined times repeatedly, and then estimates the original information bit based upon the soft-judgment output of the second decoding unit; and a second judging unit (corresponding to a second judging device 19) which makes a hard-judgment on the other bits in the received signal to estimate the original information bits.

Furthermore, the turbo encoding unit is provided with a deinterleave processing unit (corresponding to a deinterleaver 25) for carrying out a de-interleaving process on one group of the redundant bits that have been encoded after the interleave process to output the respective information bits and the redundant bits with the times being coincident with each other.

Furthermore, Reed Solomon codes and turbo codes are used combinedly, and on the transmitting side, the turbo encoding is carried out after the Reed Solomon encoding, while on the receiving side, the Reed Solomon codes are decoded after decoding the turbo codes.

The communication device according to another aspect of this invention has an encoder that uses turbo codes with the interleave process being incorporated into the encoding process. This encoder is provided with a turbo encoding unit (corresponding to a turbo encoder 1 in an embodiment which will be described later) which receives transmission data constituted by a plurality of bits, and carries out a turbo encoding process on lower bits of a predetermined number in transmission data to output information bits in accordance with the predetermined number, first redundant bits that have been obtained by convolutionally encoding the information bits and second redundant bits that have been obtained by convolutionally encoding the information bits after the interleave process; and a computing unit (corresponding to a conversion 2) which carries out calculations for uniforming error-correction capabilities on the respective information bits by using the information bits of the predetermined number and the redundant bits, in such a manner that the results of the calculations and the other bits in the transmission data are outputted as the results of the encoding process.

Furthermore, the turbo encoding unit is provided with a deinterleave processing unit (corresponding to a deinterleaver 25) for carrying out a de-interleaving process on the second redundant bits so that the respective information bits, the first redundant bits and the second redundant bits that have been. subjected to the de-interleaving process are outputted with the times being coincident with each other.

The communication device according to still another aspect of this invention has an encoder that uses turbo codes with the interleave process being incorporated into the encoding process. This encoder is provided with a turbo encoding unit which receives transmission data constituted by a plurality of bits, and carries out a turbo encoding process on lower bits of a predetermined number in transmission data to output information bits in accordance with the predetermined number, first redundant bits that have been obtained by convolutionally encoding the information bits and second redundant bits that have been obtained by convolutionally encoding the information bits after the interleave process, in such a manner that in addition to the respective information bits and the first and second redundant bits, the other bits in the transmission data are outputted as the results of the encoding process Furthermore, Reed Solomon codes and turbo codes are used combinedly, and the turbo encoding is carried out after the Reed Solomon encoding.

The communication device according to still another aspect of this invention has a decoder that decodes a received signal that has been turbo encoded by using a soft judgment. This decoder is provided with a first decoding unit (corresponding to a first decoder 11 and an adder 12) which extracts information bits and first redundant bits that have been convolutionally encoded from the lower bits of the predetermined number in the received signal, and makes a soft-judgment based upon the results of the extraction and a soft judgment output that is an output preceding by one given as preliminary information (in some cases, not given); a second decoding unit (corresponding to a second decoder 15, an interleavers 13 and 14, an adder 16 and a deinterleaver 17) which extracts the information bits in accordance with the number of outputs on the encoder side and the second redundant bits that have been convolutionally encoded in a method different from the first redundant bits from the lower bits in the predetermined number in the received signal, makes a soft-judgment based upon the results of the extraction and the soft-judgment output from the first decoding unit, and informs the first decoding unit of the results thereof as the soft-judgment output preceding by one; a first judging unit (corresponding to a first judging device 18) which executes the soft-judgment by the first decoding unit and the second decoding unit a predetermined times repeatedly, and then estimates the original information bit based upon the soft-judgment output of the second decoding unit; and a second judging unit (corresponding to a second judging device 19) which makes a hard-judgment on the other bits in the received signal to estimate the original information bits.

Furthermore, when Reed Solomon codes and turbo codes are used combinedly on the transmitting side, the Reed Solomon codes are decoded after decoding the turbo codes.

The communication method according to still another aspect of this invention, which uses turbo codes as error-correction codes, is provided with a turbo encoding step of carrying out a turbo encoding process on lower bits of a predetermined number in transmission data to output information bits in accordance with the predetermined number and first and second redundant bits that have been convolutionally encoded in different sequences; a computing step of carrying out calculations for uniforming error-correction capabilities on the respective information bits by using the information bits of the predetermined number and the redundant bits to output the results of the calculations and the other bits in the transmission data as the results of the encoding process; a first decoding step of extracting the information bits and the first redundant bits from the lower bits of the predetermined number in the received signal so as to make a soft-judgment based upon the results of the extraction and a soft judgment output that is an output preceding by one given as preliminary information (in some cases, not given); a second decoding step of extracting the information bits and the second redundant bits so as to make a soft-judgment based upon the results of the extraction and the soft-judgment output from the first decoding step, thereby informing the first decoding unit of the results thereof as the soft-judgment output preceding by one; a first judging step of executing the soft-judgment by the first decoding step and the second decoding step a predetermined times repeatedly, and then estimating the original information bit based upon the soft-judgment output of the second decoding step; and a second judging step of making a hard-judgment on the other bits in the received signal to estimate the original information bits.

Furthermore, the turbo encoding step is provided with a deinterleave processing step of carrying out a de-interleaving process on one group of the redundant bits that have been encoded after the interleave process to output the respective information bits and the redundant bits with the times being coincident with each other.

Furthermore, Reed Solomon codes and turbo codes are used combinedly, and on the transmitting side, the turbo encoding is carried out after the Reed Solomon encoding, while on the receiving side, the Reed Solomon codes are decoded after decoding the turbo codes.

BRIEF DESCRIPTION OF THE DRAWINGS

FIG. 4 is a drawing that shows a tone construction in a multi-carrier modem system and a construction of an encoder that is applicable to a 4-bit constellation;

FIG. 7 is a drawing that shows a difference in bit error rates;

BEST MODE FOR CARRYING OUT THE INVENTION

Preferred embodiments of the method of and device for communication in accordance with the present invention will be explained below with reference to the accompanying drawings. However, the present invention is not intended to be limited by these embodiments.

FIG. 1 is a drawing that shows constructions of an encoder (a combination of a turbo encoder and a conversion) and a decoder (a combination of a turbo decoder and a hard judging device) used in a communication device in accordance with the present invention in which. More specifically, FIG. 1(*a*) shows the construction of the encoder, and FIG. 1(*b*) shows the construction of the decoder according to this embodiment. In the communication device in accordance with the present embodiment, both of the constructions of the encoder and decoder are installed so that it is possible to provide a data error-correction capability with high precision, and consequently to obtain a superior transmitting characteristics in data communication and voice communication. Here, in the present embodiment, for convenience of explanation, both of the constructions are provided; however, for example, of the two devices, only the encoder may be installed in a transmitter, or only the decoder may be installed in a receiver.

Figure 1A:
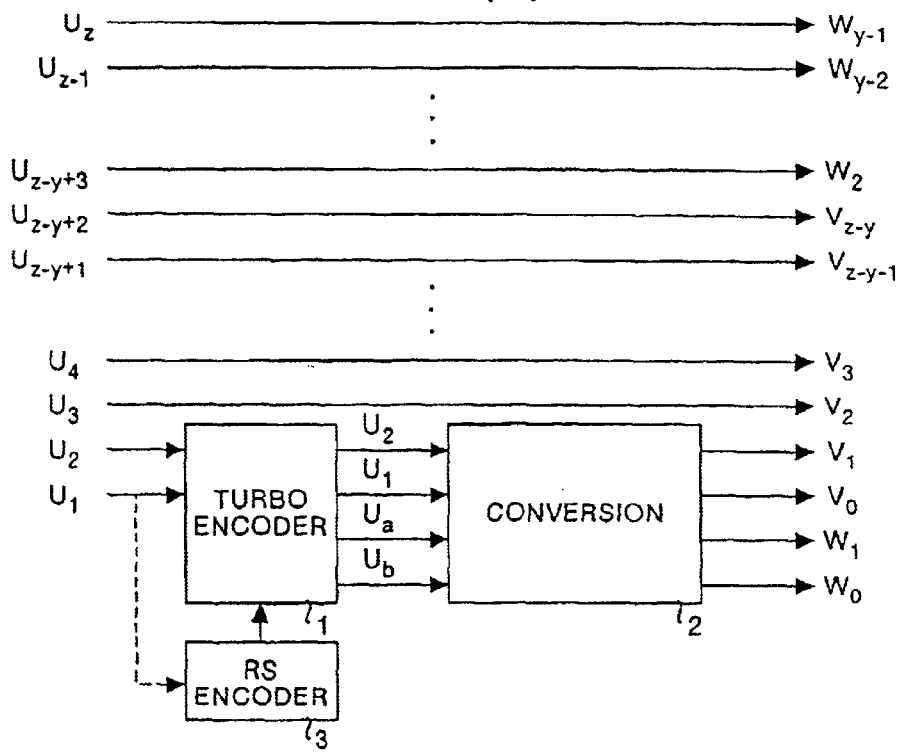
FIG. 1 is a drawing that shows constructions of an encoder and a decoder that are used in a communication device in accordance with the present invention.

Moreover, in the encoder in FIG. 1(a), reference numeral 1 denotes a turbo encoder that uses turbo codes as error-correction codes so as to provide a performance close to the Shannon limit and 2 is a conversion for converting data received from the turbo encoder 1. In the turbo encoder 1, for example, with respect to an input of two-bit information bits, two-bit information bits and two-bit redundant bits are outputted, and in the conversion 2, with respect to the received 4-bit data, calculations are carried out so as to uniform the correction capabilities with respect to the information bits on the receiving side.

Figure 1B:
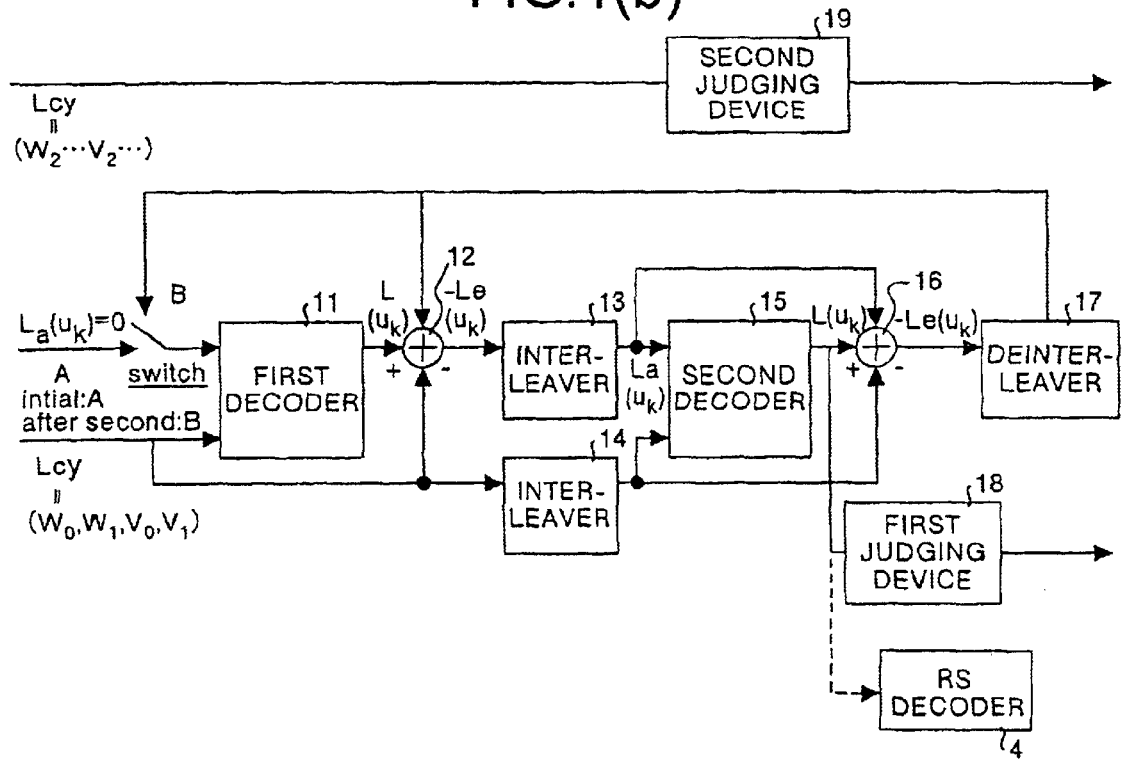

In the decoder shown in FIG. 1(b), reference numeral 11 denotes a first decoder for calculating the logarithm likeliness ratio from receiving signal: Lcy (corresponding to receiving signals: $V_0$, $V_1$, $W_0$ and $W_1$, as will be described later), 12 and 16 are adders. Reference numerals 13 and 14 denote interleavers. Reference numeral 15 denotes a second decoder for calculating the logarithm likeliness ratio from the receiving signal: Lcy (corresponding to receiving signals: $V_0$, $V_1$, $W_0$ and $W_1$, as will be described later). Reference numeral 17 denotes a deinterleaver. Reference numeral 18 denotes a first judging device for judging device for judging the output of the second decoder 15 to output an estimated value of the original information bit list, and reference numeral 19 denotes a second judging device for hard-judging the Lcy (corresponding to receiving signals: $V_2, \ldots, W_2, \ldots$, as will be described later) to output an estimated value of the original information bit list.

Prior to explaining the operations of the encoder and decoder, an explanation will be briefly given of the basic operation of the communication device in the present invention by reference to FIGS. 1–7. For example, with respect to the cable-type digital communication system for carrying out data communication by using the DMT (Discrete Multi Tone) modem system there are xDSL communication system including an ADSL (Asymmetric Digital Subscriber Line) communication system that executes a high-speed digital communication with several megabits/second by using the existing telephone lines and an HDSL (high-bit-rate Digital Subscriber Line) communication system. Here, these systems are standardized in T1.43 of the ANSI, ect. In the explanation of the present embodiment, for example, a communication device that is applicable to the ADSL is used.

Figure 2:
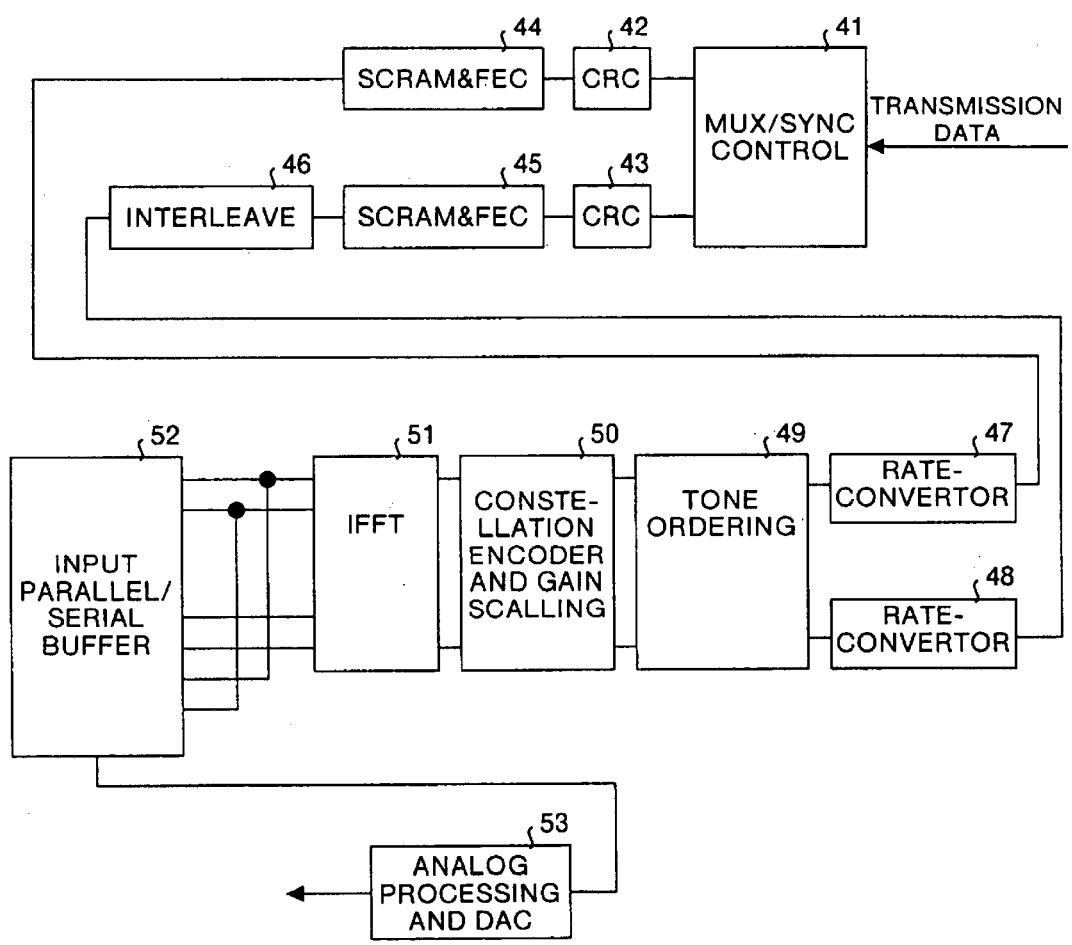
FIG. 2 is a drawing that shows a construction of a transmitting system of a transmitter in accordance of a transmitting system of a transmitter in accordance with the present invention.

FIG. 2 is a drawing that shows the construction of a transmitting system of a communication device in accordance with the present invention. In this transmitting system, the transmission data is multiplexed by a multiplex/synch control (corresponding to a MUS/SYNC CONTROL in the Figure) 41, and error-correction codes are added to the transmission data that has been multiplexed in cyclic redundancy checks (corresponding to CRC: Cyclic Redundancy Checks) 42, 43, and FEC-use codes are added thereto and a scrambling process is also applied thereto in forward error corrections (corresponding to SCRAM & FEC) 44, 45.

There are two paths from the multiplex/synch control 41 to a tone ordering 49, and one is an interleaved data buffer path containing the interleave 46, and the other is a fast data buffer path that does not contain the interleave 46; thus, for example, the interleaved data buffer path for executing an interleaving process has a greater delay.

Thereafter, the transmission data is subjected to a rate converting process in rate convertors (corresponding to RATE-CONVERTORS) 47, 48, and then subjected to a tone ordering process in the tone ordering (corresponding to TONE-ORERING) 49. Based upon the transmission data after the tone ordering process, constellation data is formed in a constellation encoder/gain scaling (corresponding to CONSTELLATION AND AGAIN SCALING) 50, and this is subjected to an inverse Fast Fourier transform in an inverse Fast Fourier transform section (corresponding to IFFT: Inverse Fast Fourier transform) 51.

Finally, after the Fourier transform, the parallel data is converted to serial data in an input parallel/serial buffer (corresponding to INPUT PARALLEL/SERIAL BUFFER) 52, and the digital waveform is converted to an analog waveform in analog processing/digital-analog converter (corresponding to ANALOG PROCESSING AND DAC) 53; then, after having been subjected to a filtering process, the resulting transmission data is transmitted to a telephone line.

Figure 3:
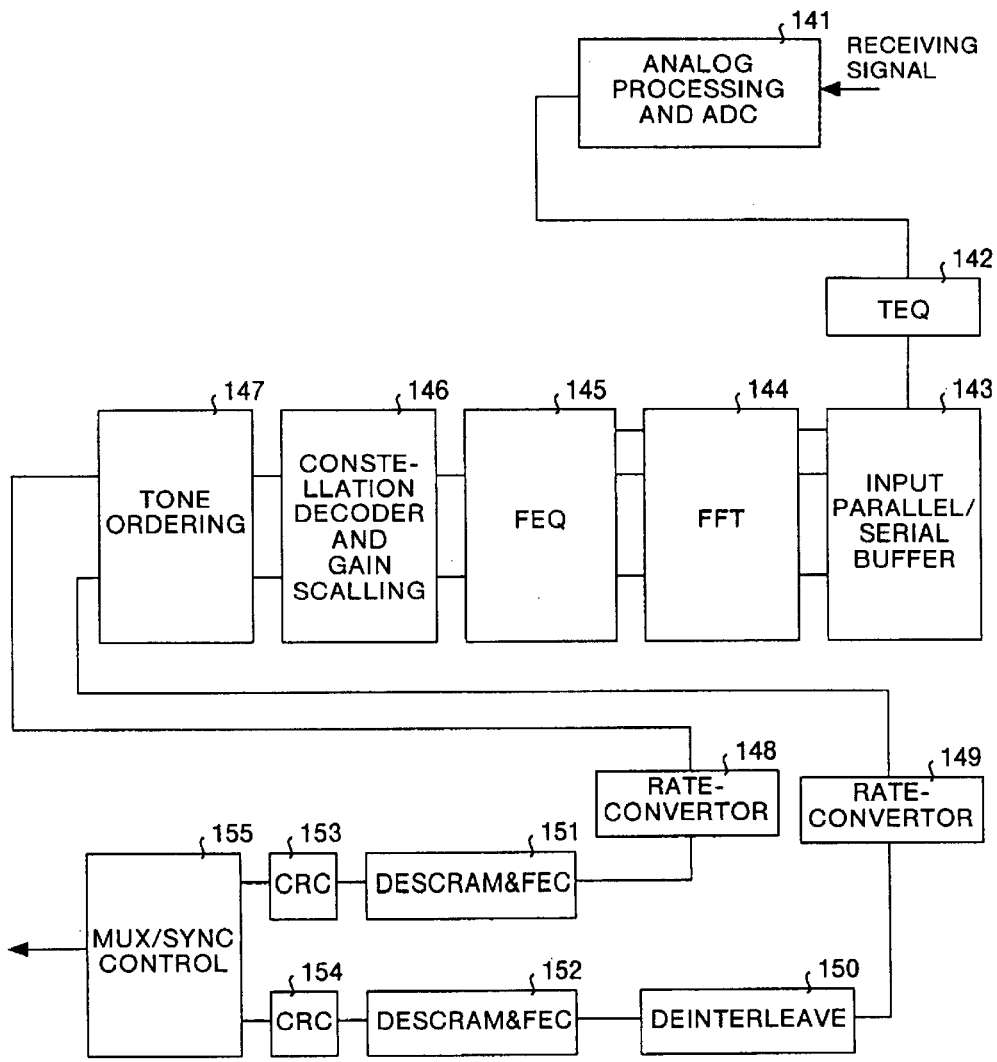
FIG. 3 is a drawing that shows a construction of a receiving system in accordance with the present invention.

FIG. 3 is a drawing that shows a construction of a receiving system of the communication device in accordance with the present invention. In this receiving system, the received data (corresponding to the above-mentioned transmission data) is subjected to a filtering process in an analog processing/analog-digital converter (corresponding to ANALOG PROCESSING AND ADC in the Figure) 141, and the analog waveform is converted to a digital waveform; thereafter, this is subjected to an adaptive equalization process with respect to the time domain in a time domain equalizer (corresponding to TEQ) 142.

With respect to the data having been subjected to the adaptive equalization process, this is converted from serial data to parallel data in an input serial/parallel buffer (corresponding to INPUT SERIAL/PARALLEL BUFFER) 143, and this parallel data is subjected to a fast Fourier transform in a fast Fourier transform section (corresponding to FFT: Fast Fourier transform) 144; thereafter, this is subjected to an adaptive equalization process with respect to the frequency domain in a frequency domain equalizer (corresponding to FEQ) 145.

The data, which has been subjected to the adaptive equalization process with respect to the frequency domain, is subjected to a composite process (most likeliness composite method) and a tone ordering process in a constellation decoder/gain scaling (corresponding to CONSTELLATION DECODER AND GAIN SCALING) 146 and a tone ordering (corresponding to TONE ORDERING) 147 so that this is converted to serial data. Thereafter, this is subjected to processes, such as a rate converting process by rate converters (corresponding to RATE-CONVERTER) 148, 149, a de-interleaving process in a deinterleave (corresponding to DEINTERLEAVE) 150, an FEC process and a de-scrambling process in forward error corrections (corresponding to DESCRAM & FEC) 151, 152, and a cyclic redundancy check in cyclic redundancy checks (corresponding to cyclic redundancy checks) 153, 154; thus, the received data is finally reproduced from a multiplex/synch control (corresponding to MUX/SYNC CONTROL) 155.

In the communication device as described above, the two paths are provided respectively in the receiving system and transmitting system, and by using these two paths properly or using these two paths at the same time, it is possible to realize a low-transmission delay and data communication with high rates.

In the communication device, the encoder shown in FIG. 1(a) is positioned at the constellation encoder/gain scaling 50 in the transmitting system, and the decoder shown in FIG. 1(b) is positioned at the constellation decoder/gain scaling 146 in the receiving system.

Operations of the encoder (transmitting system) and the decoder (receiving system) will now be explained in details. First, operations of the encoder which is shown in FIG. 1(a) will be explained. FIG. 4 shows a tone structure (see (a)) in the multi-carrier modem system and a construction (see (b)) of the encoder that is applicable to the 4-bit constellation. Here, in the present embodiment, as illustrated in FIG. 4(a), with respect to the multi-value Quadrature Amplitude Modulation (QAM), for example, a 16 QAM system is adopted, and with respect to two tones in the multi-carrier, an encoding process is carried out. Moreover, in the encoder of the present embodiment, different from the conventional technique that executes a turbo encoding process on all the input data, the turbo encoding process is executed on the input data of the lower two bits as illustrated in FIG. 4(b), and with respect to the other upper bits, the input data, as it is, is outputted.

Figure 5:
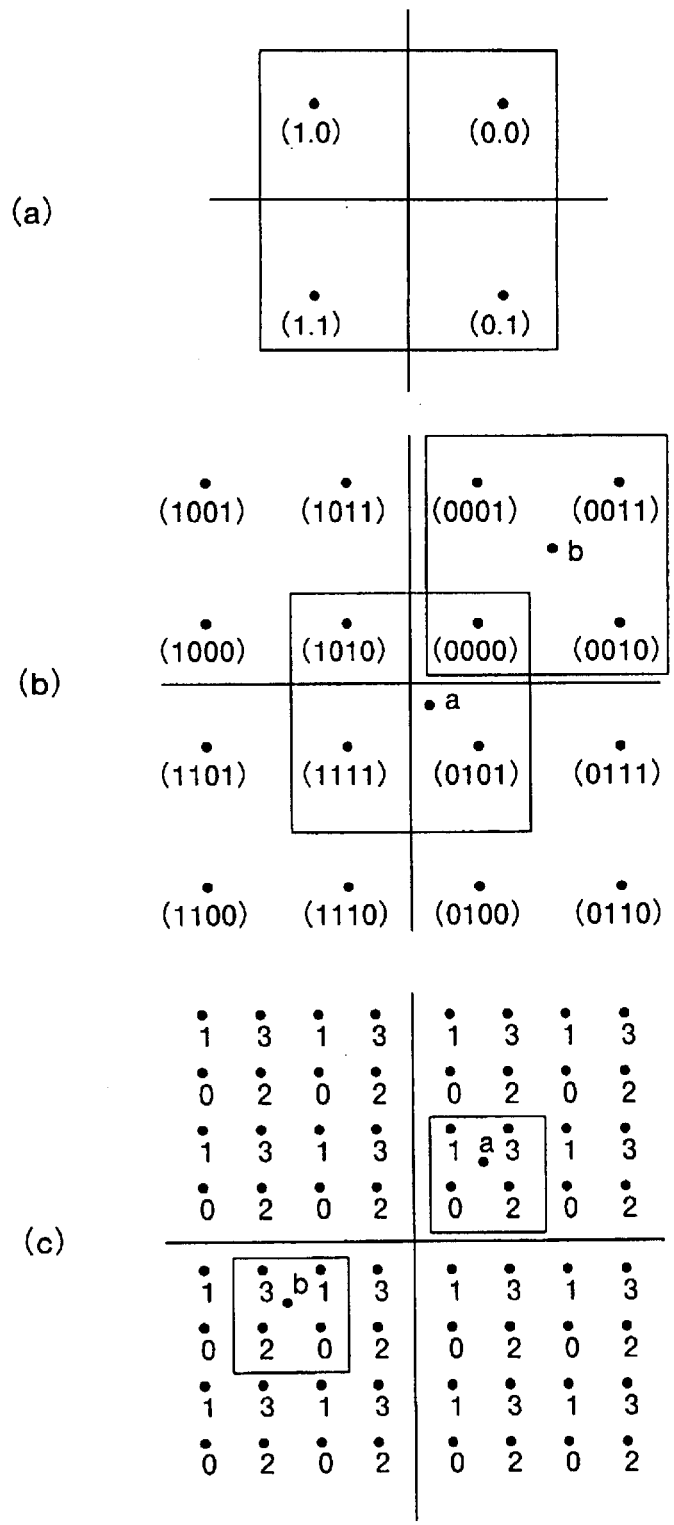
FIG. 5 is a drawing that shows a layout of signal points in various digital modulations.

Here, the following description will discuss why only the lower two bits of the input data are subjected to the turbo encoding process. FIG. 5 is a drawing that shows the layout of signal points in various digital modulations; and more specifically, FIG. 5(a) shows the layout of signal points in the 4-phase shift keying (PSK) system, FIG. 5(b) shows the layout of signal points in the 16 QAM system, and FIG. 5(c) shows the layout of signal points in the 64 QAM system.

For example, when, in the layout of signal points in all the modulation systems, the received signal points are a or b positions, on the receiving side, normally, the data having the most likelihood is estimated as the information bit list (transmission data) through a soft-judgment. In other words, the signal point having the closest distance to the received signal point is judged as the transmission data. However, at this time, for example, when attention is given to the received signal points a and b in FIG. 5, it is found that the four points, which are closest to thee received signal point, have lower two bits represented by (0, 0) (0, 1) (1, 0) (1, 1), in any of the cases (corresponding to FIGS. 5(a), (b) and (c)). Therefore, in the present embodiment, with respect to the lower two bits of the four signal points (the four points closest to received signal point) that are more likely to have degradation in the characteristics, the turbo encoding process having a superior error-correction capability is applied thereto, and a soft-judgment is carried out on the receiving side. In contrast, with respect to the other higher bits that are less likely to have degradation in the characteristics, these bits are outputted as they are, and a hard-judgment is made on the receiving side. Here, with respect to information bit lists $u_3$, $u_4$, $u_5$ and $u_6$, $v_2$, $v_3$, $w_2$ and $w_3$ respectively correspond to these.

Thus, in the present embodiment, the characteristics that might have degradation due to multi-valued levels can be improved, and since the turbo encoding process is carried out only on the lower two bits of the received signal, it is possible to greatly reduce the amount of calculations as compared with the conventional technique that applies the turbo encoding process to all the bits.

Figure 6:
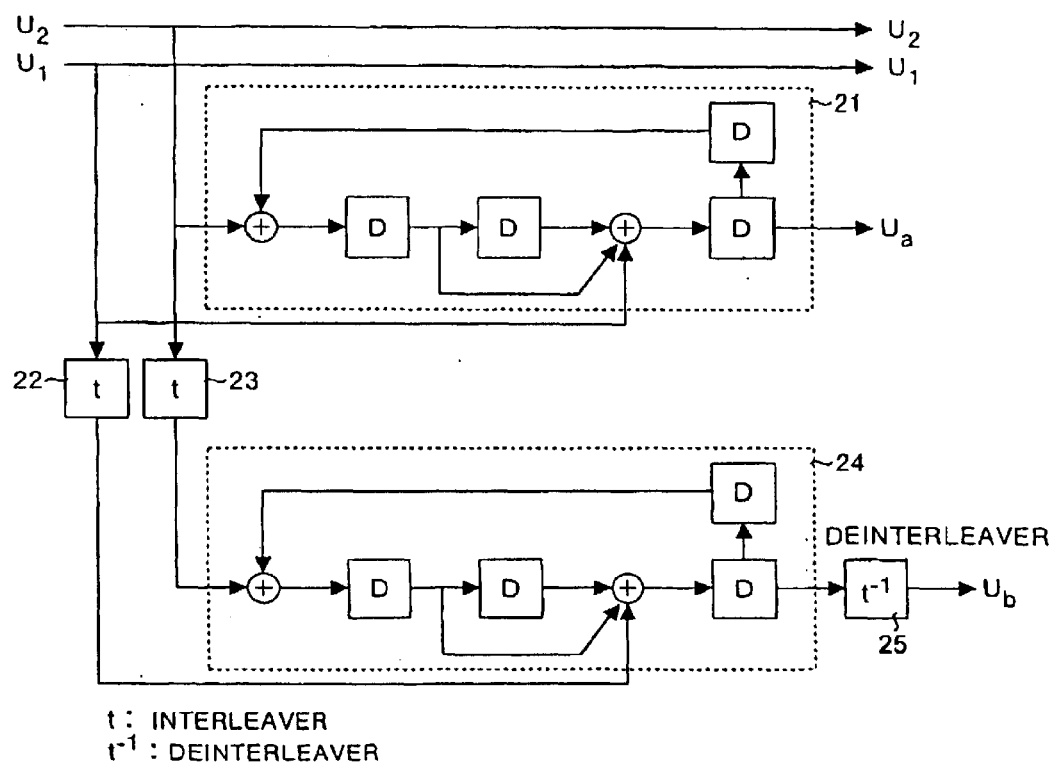
FIG. 6 is a drawing that shows a circuit construction of a turbo encoder 1.
Figure 8A:
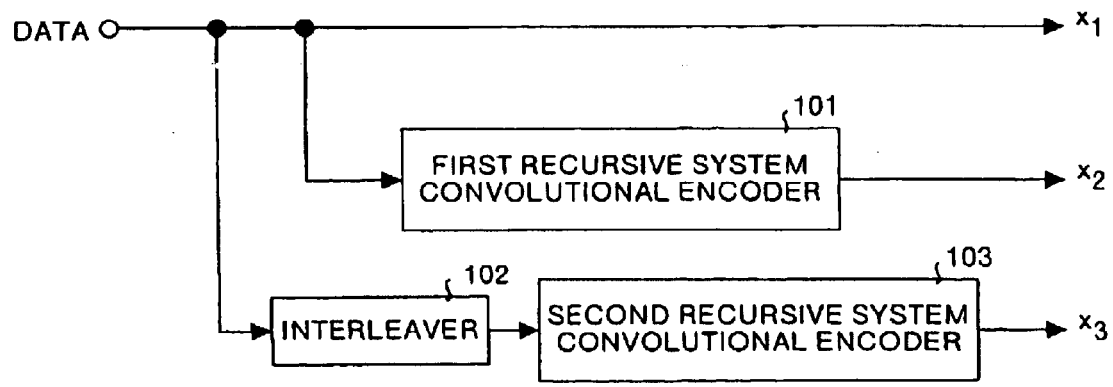
FIG. 8 is a drawing that shows a construction of a conventional turbo encoder.
Figure 8B:
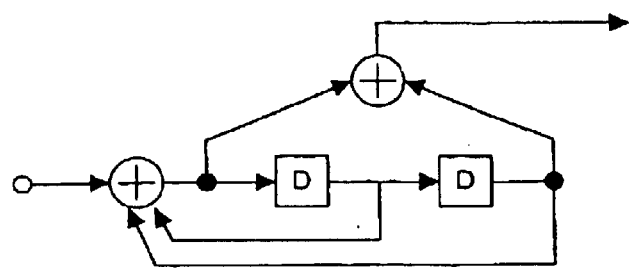
Figure 9:
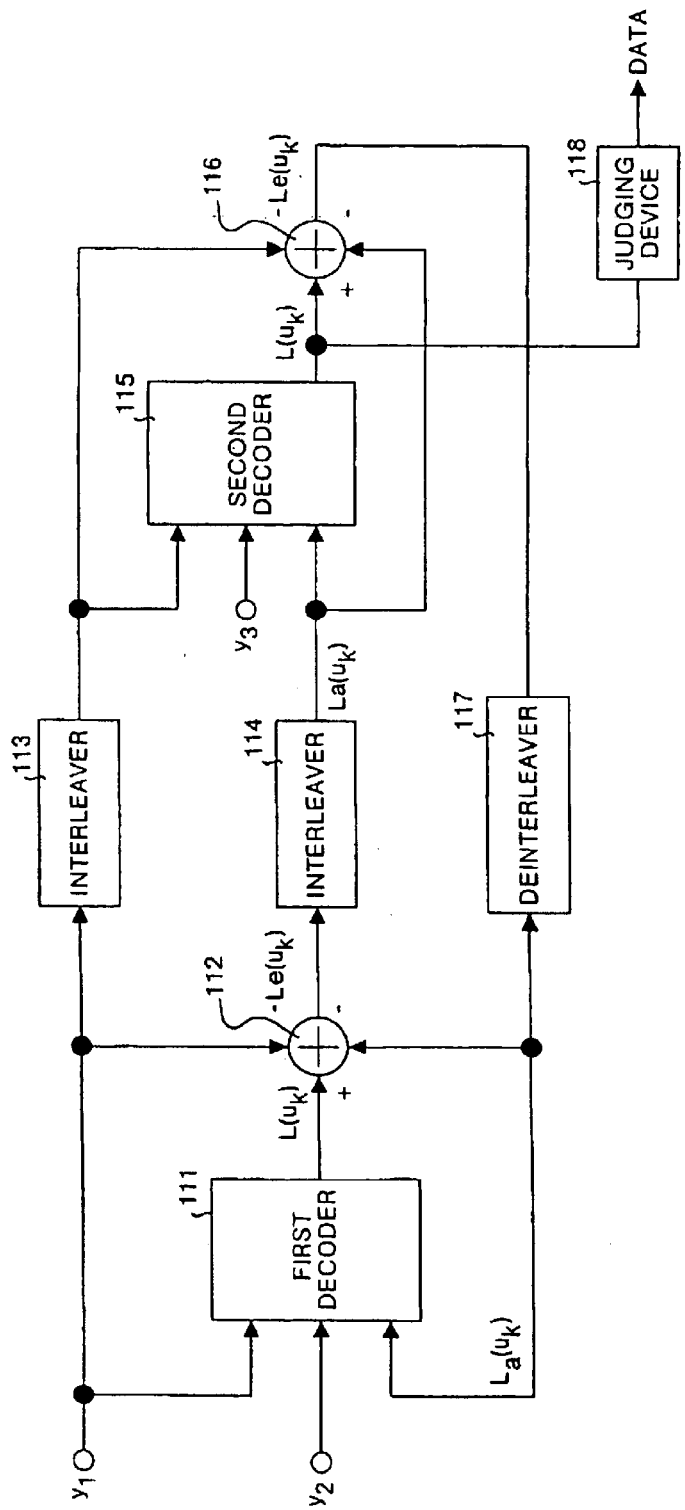
FIG. 9 is a drawing that shows a construction of a conventional turbo decoder.

The following description will discuss the operation of the turbo encoder 1 shown in FIG. 4(b) that carries out the turbo encoding process on the inputted lower two bits of the received data: $u_1$ and $u_2$. FIG. 6 is a drawing that shows the circuit construction of the turbo encoder 1, Reference numeral 21 denotes a first recursive system convolutional encoder. Reference numerals 22 and 23 denote interleavers. Reference numeral 24 denotes a second recursive system convolutional encoder, and reference numeral 25 denotes a deinterleaver. In the turbo encoder 1, the transmission data: $u_{1k}$ and $u_{2k}$ (with k representing the time) corresponding to the information list, redundant data: $u_{ak}$ obtained by encoding the transmission data through the process of the first recursive system convolutional encoder 21 and redundant data: $u_{bk}$ obtained by encoding the transmission data that has been interleave-processed through the second recursive system convolutional encoder 24, and then allowing it to have the original time through the deinterleave process, are simultaneously outputted.

In this manner, in the present embodiment, the arrangement in which the de-interleaver 25 is added to the second recursive convolutional encoder 24 as its following stage is used so that the times of the transmission data and the redundant data are made coincident with each other; thus, it is possible to efficiently carry out the calculating processes in the succeeding conversion 2.

Next, the conversion 2, which has received the two-bit transmission data: $u_1$ and $u_2$ and the two-bit redundant data: $u_a$ and $u_b$ from the turbo encoder 1, carries out calculating processes so as to provide uniform correction capabilities with respect to the transmission data on the receiving side.

For example, when the transmission data: $u_1$ and $u_2$ and the redundant data: $u_a$ and $u_b$ are transmitted without the conversion 2, on the receiving side, the original transmission data: $u_1$ and $u_2$ are estimated by using the received signals: $u_a'$ and $u_b'$ (' represents the received signal containing influences from noise and phasing in the transmission path). However, in this case, the received data: $u_a'$ corresponding to the output of the first recursive system convolutional encoder 21 and the received data: $u_b'$ outputted through each interleaver, the second recursive system convolutional encoder 24 and each di-interleaver are different in their error-correction capability; therefore, as illustrated in FIG. 7, they come to have a difference in the probability in bit errors. Therefore, in the present embodiment, the bit error rates on the receiving side are uniformed by executing the following computation formulas:

$$v_1 = u_2 + u_a \quad (3)$$

$$v_0 = u_2 \quad (4)$$

$$w_1 = u_2 + u_1 + u_a + u_b \quad (5)$$

$$w_0 = u_2 + u_1 \quad (6)$$

Here, the above-mentioned v and w correspond to the respective tones shown in FIG. 4(a).

In this manner, in the present embodiment, the turbo encoder 1 and the conversion 2 are provided in the encoder so that the device can be applied to the communication using the multi-carrier modem system, and even when the constellation increases due to multi-valued levels in the modulation system, it is possible to reduce the amount of calculations, and also to achieve a good transmitting characteristics in the same manner as the conventional device. Here, in the present embodiment, the turbo encoder 1 and the conversion 2 are installed in the encoder; however, the present invention is not intended to be limited to this arrangement, and for example, when a difference in the bit error rate is permitted, the conversion 2 may be omitted, and it is still possible to reduce the amount of calculations. Moreover, in the present embodiment, the explanation has been given of the 16 QAM system as an example; however, the present invention is not intended to be limited by this, and even in the case of the application to the other modulation systems (256 QAM system, etc.), the same effects can be obtained.

Next, operations of the decoder which is shown in FIG. 1(*b*) will be explained now. Here, in the present embodiment, for example, the 16 QAM system is adopted as the multi-value quadrature amplitude modulation (QAM), and the following description will discuss a case in which two tones in the multi-carrier are subjected to a decoding process. Moreover, in the encoder of the present embodiment, the turbo encoding process is carried out on the lower two bits of the received data, and the original transmission data is estimated by a soft-judgment, and with respect to the other upper bits, the original transmission data is estimated by carrying out a hard-judgment on the received data in the second judging device 19. Here, the received signals Lcy: $V_0$, $V_1$, $V_2$, $V_3$, $W_0$, $W_1$, $W_2$, $W_3$ are signals obtained by allowing the outputs on the transmitting side: $v_0$, $v_1$, $v_2$, $v_3$, $w_0$, $w_1$, $w_2$, $w_3$ to contain influences from noise and phasing due to the transmission path.

First, in the turbo encoder, upon receipt of the signals Lcy: $V_0$, $V_1$, $W_0$, $W_1$, the first decoder 11 calculates the logarithm likelihood ratio: $L(u_{1k}')$, $L(u_{2k}')$ (with k representing the time) of estimated bits: $u_{1k}'$, $u_{2k}'$ estimated by these received signals. Here, with respect to the decoder for calculating the logarithm likelihood ratio, for example, the known maximum A-Posteriori (MAP algorithm) is often used; however, for example, the known Vitabi decoder may be used.

In this case, the logarithm likelihood ratio: $L(u_{1k}')$, $L(u_{2k}')$ are represented by the following equations:

$$L(u_{1k'}) = L_{cy} + La(u_{1k}) + Le(u_{1k}) \quad (7)$$
$$= \mathrm{Ln} \frac{Pr(u_{1k'} = 1|\{Lcy\})}{Pr(u_{1k'} = 0|\{Lcy\})}$$

$$L(u_{2k'}) = L_{cy} + La(u_{2k}) + Le(u_{2k}) \quad (8)$$
$$= \mathrm{Ln} \frac{Pr(u_{2k'} = 1|\{Lcy\})}{Pr(u_{2k'} = 0|\{Lcy\})}$$

Here, in the present embodiment, $Le(u_{1k})$, $Le(u_{2k})$ represent external information; $La(u_{1k})$, $La(u_{2k})$ represent pre-information that is external information preceding by one; $P_r(u_{1k'}=1|\{Lcy\})$ represents the post-probability of the estimated information bit: $u_{1k}'$ being 1 upon receipt of all the lists of the received signals: $\{Lcy\}$; $P_r(u_{1k'}0|\{Lcy\})$ represents the post-probability of the estimated information bit: $u_{1k}'$ being 0; $P_r(u_{2k'}=1|\{LcY\})$ represents the post-probability of the estimated information bit: $u_{2k}'$ being 1 upon receipt of all the lists of the received signals: $\{Lcy\}$; and $P_r(u_{2k'}=0|\{Lcy\})$ represents the post-probability of the estimated information bit: $u_{2k}'$ being 0. In other words, in equations (7) and (8), the probability of $u_{2k}'$ being 1 with respect to the probability of $u_{2k}'$ being 0, and the probability of $u_{1k}'$ being 1 with respect to the probability of $u_{1k}'$ being 0 are found.

Next, in the adder 12, external information for the second decoder 15 is calculated from the logarithm likelihood ratio that is the above calculation result. The external information: $Le(u_{1k})$, $Le(u_{2k})$ is represented as follows based upon the above-mentioned equations (7) and (8):

$$Le(u_{1k}) = L(u_{1k}') - Lcy - La(u_{1k}) \quad (9)$$
$$Le(u_{2k}) = L(u_{2k}') - Lcy - La(u_{2k}) \quad (10)$$

Here, in the first decoding process, since no pre-information is found, $La(u_{1k})=0$, and $La(u_{2k})=0$.

Next, in the interleavers 13 and 14, the signals are re-arranged based upon the received signal Lcy and the external information $Le(u_{1k})$, $Le(u_{2k})$. Then, in the second decoder 15, in the same manner as the first decoder 11, based upon the received signal Lcy and pre-information: $La(u_{1k})$, $La(u_{2k})$ that has been preliminarily calculated, the logarithm likelihood ratio: $L(u_{2k}')$, $L(u_{2k}')$ is calculated. Thereafter, in the adder 16, in the same manner as the adder 12, external information: $Le(u_{1k})$, $Le(u_{2k})$ is calculated by using equations (9) and (10). At this time, the external information, re-arranged by the deinterleave 17, is fedback to the first decoder 11 as the pre-information: $La(u_{1k})$, $La(u_{2k})$.

Thereafter, in the above-mentioned turbo decoder, the above-mentioned processes are repeated predetermined times so that the logarithm likelihood ratio with higher precision is calculated; and lastly, the first judging device 18 judges the signals based upon the logarithm likelihood ratio so as to estimate the original transmission data. More specifically, for example, if the logarithm likelihood ratio shows "$L(u_{1k}')>0$"; then, $u_{1k}'$ is judged as 1, and if it shows "$L(u_{1k}')\leq 0$"; then, $u_{1k}'$ is judged as 0; in the same manner, if the logarithm likelihood ratio shows "$L(u_{2k}')>0$"; then, $u_{2k}'$ is judged as 1, and if it shows "$L(u_{2k}')\leq 0$"; then, $u_{2k}'$ is judged as 0. Here, with respect to the received signals Lcy: $V_2$, $V_3$, $W_2$, $W_3$ that are simultaneously received, they are hard-judged by using the second judging device 19.

In this manner, in the present embodiment, even when the constellatin increases as the modulation system is multi-valued, the turbo decoder for carrying out a soft-judgment on the lower two bits of the received signal that are more susceptible to degradation in the characteristics and the judging device for carrying out a hard-judgment on the other bits of the received signal are provided; thus, it is possible to reduce the soft-judgment portions having a great amount of calculations, and also to achieve a good transmitting characteristic in the same manner as the conventional device. Additionally, in the transmission path having random errors and burst errors in a mixed manner as described in the present embodiment, by adopting the R-S codes (Reed Solomon) 3, 4 for carrying out error corrections on a symbol basis and other known error-correction codes in a combined manner, it is possible to obtain a further superior transmission characteristic.

As described above, in accordance with the present invention, the communication device is made applicable to communication using the multi-carrier modem system, and is provided with a turbo encoding unit and a computing unit. Therefore, even when the constellation increases as the modulation system is multi-valued, it is possible to reduce the amount of calculations, and also to achieve a good transmitting characteristic in the same manner as the conventional device. Moreover, a soft-judgment is carried out on the lower two bits of the received signal that are more susceptible to degradation in the characteristics, and a hard-judgment is carried out on the other bits of the received signal. Therefore, even when the constellation increases as the modulation system is multi-valued, it is possible to provide a communication device which can reduce the soft-judgment portions having a great amount of calculations, and also achieve a good transmitting characteristic in the same manner as the conventional device.

In accordance with the next invention, the communication device has an arrangement in which a deinterleave processing unit is added to the turbo encoding unit so that the times of the transmission data and redundant data are made coincident with each other. Therefore, it is possible to provide a communication device which can effectively carry out calculation processes in the succeeding computing unit.

In accordance with the next invention, even in a transmission path having random errors and burst errors in a mixed manner, since the R-S codes for carrying out error corrections on a symbol basis are combinedly used, it becomes possible to provide a communication device which can provide a further superior transmission characteristic.

In accordance with the next invention, the communication device is made applicable to communication using the multi-carrier modem system, and is provided with a turbo encoding unit and a computing unit. Therefore, even when the constellation increases as the modulation system is multi-valued, it is possible to reduce the amount of calculations, and also to achieve a good transmitting characteristic in the same manner as the conventional device.

In accordance with the next invention, the communication device has an arrangement in which a deinterleave processing unit is added to the turbo encoding unit so that the times of the transmission data and redundant data are made coincident with each other. Therefore, it is possible to provide a communication device which can effectively carry out calculation processes in the succeeding computing unit.

In accordance with the next invention, when a difference in the bit error rate with respect to respective information bits is permitted, the computing unit may be omitted, and it is possible to further reduce the amount of calculations.

In accordance with the next invention, even in a transmission path having random errors and burst errors in a mixed manner, since the R-S codes for carrying out error corrections on a symbol basis are combinedly used, it becomes possible to provide a further superior transmission characteristic.

In accordance with the next invention, a soft-judgment is carried out on the lower two bits of the received signal that are more susceptible to degradation in the characteristics, and a hard-judgment is carried out on the other bits of the received signal; thus, even when the constellation increases as the modulation system is multi-valued, it is possible to provide a communication device which can reduce the soft-judgment portions having a great amount of calculations, and also achieve a good transmitting characteristic in the same manner as the conventional device.

In accordance with the next invention, even in a transmission path having random errors and burst errors in a mixed manner, since the R-S codes for carrying out error corrections on a symbol basis are combinedly used, it becomes possible to provide a further superior transmission characteristic.

In accordance with the next invention, the communication device is made applicable to communication using the multi-carrier modem system, and is provided with a turbo encoding unit and a computing unit. Therefore, even when the constellation increases as the modulation system is multi-valued, it is possible to reduce the amount of calculations, and also to achieve a good transmitting characteristic in the same manner as the convolutional method. Moreover, a soft-judgment is carried out on the lower two bits of the received signal that are more susceptible to degradation in the characteristics, and a hard-judgment is carried out on the other bits of the received signal. Therefore, even when the constellation increases as the modulation system is multi-valued, it is possible to provide a communication method which can reduce the soft-judgment portions having a great amount of calculations, and also achieve a good transmitting characteristic in the same manner as the conventional method.

In accordance with the next invention, even in a transmission path having random errors and burst errors in a mixed manner, since the R-S codes for carrying out error corrections on a symbol basis are combinedly used, it becomes possible to provide a communication method which achieves a further superior transmission characteristic.

INDUSTRIAL APPLICABILITY

As described above, the communication device in accordance with the present invention is effectively applied to data communications using the DMT (Discrete Multi Tone) modem system and the OFDM (Orthogonal Frequency Division Multiplex) modem system, and in particular, to xDSL communication systems such as the XDSL communication systems including an ADSL (Asymmetric Digital Subscriber Line) communication system and an HDSL (High-Bit-Rate Digital Subscriber line) communication system that execute a high-speed digital communication with several mega bits/second by using the existing telephone lines.

What is claimed is:

1. A communication device, which uses turbo codes as error-correction codes, comprising:
   a transmitter that includes a tubo encoding unit which carries out a turbo encoding process on a predetermined number of lower bits in transmission data and outputs information bits corresponding to the lower bits and first and second redundant bits that have been convolutionally encoded in different sequences, wherein the transmitter transmits the output of the turbo encoding unit and upper bits of the transmission data; and
   a receiver that includes:
      a first decoding unit which extracts the information bits and the first redundant bit from a received signal, and makes a soft-judgment on the lower bits based upon either the results of the extraction and a previous soft judgment output or only the results of the extraction;
      a second decoding unit which extracts the information bits and the second redundant bit from the received signal, makes a soft-judgment on the lower bits based upon the results of the extraction and the soft-judgment output from said first decoding unit, and informs said first decoding unit of the result of the soft-judgment as the previous soft-judgment output;
      a first judging unit which makes a hard-judgment on the lower bits based upon the soft-judgment output of said second decoding unit after the first and a second judging unit execute the soft-judgment repeatedly; and
      a second judging unit which makes a hard-judgment on the upper bits of the transmission data based upon the received signal.

2. The communication device according to claim 1, wherein said turbo encoding unit includes a deinterleave processing unit for carrying out a de-interleaving process on one group of the redundant bits that have been encoded after the interleave process to output the respective information bits and the redundant bits with the times being coincident with each other.

3. The communication device according to claim 1, wherein Reed Solomon codes and turbo codes are used combinedly, and on the transmitting side, the turbo encoding is carried out after the Reed Solomon encoding, while on the receiving side, the Reed Solomon codes are decoded after decoding the turbo codes.

4. A communication device comprising an encoder that uses turbo codes with an interleave process being incorporated into an encoding process, and outputs results of the encoding process,
   said encoder includes,
      a turbo encoding unit which receives transmission data constituted by a plurality of bits, and carries out a turbo encoding process on a predetermined number of lower bits in the transmission data to output information bits in accordance with the predetermined number, including a first redundant bit being obtained by convolutinally encoding the information bits and a second redundant bit being obtained by convolutionally encoding the information bits after the interleave process; and a computing unit which carries out calculations for uniforming error-correction capabilities on the respective information bits by using the information bits and the redundant bits, wherein the results of the calculations and upper bits in the transmission data are outputted as the results of the encoding process.

5. The communication device according to claim 4, wherein said turbo encoding unit includes a deinterleave processing unit which carries out a de-interleaving process on the second redundant bits, wherein the respective information bits, the first redundant bits and the second redundant bits that have been subjected to the de-interleaving process are outputted with the times being coincident with each other.

6. The communication device according to claim 4, wherein Reed Solomon codes and turbo codes are used combinedly and the turbo encoding is carried out after the Reed Solomon encoding.

7. A communication device comprising an encoder that uses turbo codes with an interleave process being incorporated into an encoding process, and output results of the encoding process, said encoder includes a turbo encoding unit which receives transmission data constituted by a plurality of bits, and carries out a turbo encoding process on a predetermined number of lower bits in the transmission data, and outputs information bits corresponding to the lower bits, a first and a second redundant bit, the first redundant bit being obtained by convolutionally encoding the information bits, and the second redundant bit being obtained by convolutionally encoding the information bits after the interleave process, wherein, in addition to the respective information bits and the first and the second redundant bits, upper bits in the transmission data are outputted as the results of the encoding process.

8. The communication device according to claim 7, wherein Reed Solomon codes and turbo codes are used combinedly and the turbo encoding is carried out after the Reed Solomon encoding.

9. A communication device comprising a decoder that decodes a received signal, the received signal comprising information bits and a first and a second redundant bit encoded based upon a predetermined number of lower bits of transmission data, said decoder including, a first decoding unit which makes a soft-judgment on the information bit based upon the received signal and a previous soft-judgment output;

a second decoding unit which makes a soft-judgment based upon the received signal and the soft-judgment output from said first decoding unit, and informs said first decoding unit of the results of the soft-judgment as the previous soft-judgment output;

a first judging unit which estimates the lower bits of the transmission data based upon the soft-judgment output of said second decoding unit after the first and a second judging unit execute the soft-judgment; and a second judging unit which makes a hard-judgment on upper bits of the transmission data based upon a plurality of bits in the received signal corresponding to the upper bits of the transmission data.

10. The communication device according to claim 9, wherein, when Reed Solomon codes and turbo codes are used combinedly on the transmitting side, the Reed Solomon codes are decoded after decoding the turbo codes.

11. A communication method, which uses turbo codes as error-correction codes, the method comprising:

a transmission step that includes:

a turbo encoding step of carrying out a turbo encoding process on a predetermined number of lower bits in transmission data and outputs information bits corresponding to the lower bits and a first and second redundant bit convolutionally encoded in different sequences; and a receiving step that includes:

a first decoding step of extracting the information bits and the first redundant bit from a received signal and making a soft-judgment based upon either the results of the extraction and a previous soft judgment output;

a second decoding step of extracting the information bits and the second redundant bit from the received signal and making a soft-judgment based upon the results of the extraction and a soft-judgment output from the first decoding step, thereby generating the results of the soft-judgment as the previous soft-judgment output;

a first judging step of estimating the lower bits of the transmission data based upon the result of the soft-judgment generated in the second decoding step; and a second judging step of making a hard-judgment on the upper bits of the transmission data based upon the received signal.

12. The communication method according to claim 11, wherein the turbo encoding step includes a deinterleave processing step of carrying out a de-interleaving process on one group of the redundant bits that have been encoded after the interleave process, wherein the respective information bits and the redundant bits are outputted with the times being coincident with each other.

13. The communication method according to claim 11, wherein Reed Solomon codes and turbo codes are used combinedly, and on the transmitting side, the turbo encoding is carried out after the Reed Solomon encoding, while on the receiving side, the Reed Solomon codes are decoded after decoding the turbo codes.

14. The communication device according to claim 1, further comprising a computing unit which carries out calculations for uniforming error-correction capabilities on the respective information bits by using the information bits corresponding to the lower bits and the redundant bits, wherein the transmitter transmits the upper bits of the transmission data and transmits the results of the calculations by the computing unit as the output.

15. The communication method according to claim 11, further including a computing step of carrying out calculations for uniforming error-correction capabilities on the respective information bits by using the information bits corresponding to the lower bits and the redundant bits, wherein, in the transmission step, the upper bits of the transmission data and the results of the calculations at the computing step are transmitted as the results of the turbo encoding step.

* * * * *